US007056383B2

(12) United States Patent
Helava et al.

(10) Patent No.: US 7,056,383 B2
(45) Date of Patent: Jun. 6, 2006

(54) TANTALUM BASED CRUCIBLE

(75) Inventors: Heikki I. Helava, Piedmont, CA (US); Mark G. Ramm, Forest Hills, NY (US)

(73) Assignee: The Fox Group, Inc., Ripon, CA (US)

( * ) Notice: Subject to any disclaimer, the term of this patent is extended or adjusted under 35 U.S.C. 154(b) by 0 days.

(21) Appl. No.: 10/779,203

(22) Filed: Feb. 13, 2004

(65) Prior Publication Data

US 2005/0178315 A1 Aug. 18, 2005

(51) Int. Cl.
C30B 25/14 (2006.01)
(52) U.S. Cl. .................. 117/103; 117/107; 117/109; 117/952
(58) Field of Classification Search .......... 117/103, 117/107, 109, 200, 952, 84
See application file for complete search history.

(56) References Cited

U.S. PATENT DOCUMENTS

| | | | |
|---|---|---|---|
| 2,854,364 A | 9/1958 | Lely | |
| 4,125,756 A | 11/1978 | Hierholzer et al. | |
| 4,147,572 A | 4/1979 | Vodakov et al. | |
| 4,302,508 A | 11/1981 | Hierholzer et al. | |
| 4,556,436 A | 12/1985 | Addamiano | |
| 4,866,005 A | 9/1989 | Davis et al. | |
| 5,433,167 A | 7/1995 | Furukawa et al. | |
| 5,964,944 A | 10/1999 | Sugiyama et al. | |
| 6,261,363 B1 | 7/2001 | Vodakov et al. | |
| 6,428,621 B1 | 8/2002 | Vodakov et al. | |
| 6,508,880 B1 | 1/2003 | Vodakov et al. | |
| 6,534,026 B1 | 3/2003 | Vodakov et al. | |
| 6,537,371 B1 | 3/2003 | Vodakov et al. | |
| 6,562,130 B1 | 5/2003 | Vodakov et al. | |
| 6,562,131 B1 | 5/2003 | Vodakov et al. | |

FOREIGN PATENT DOCUMENTS

| | | |
|---|---|---|
| DE | 3230727 | 2/1984 |
| JP | 11116399 | 10/1997 |
| JP | 11116398 | 4/1999 |
| RU | 403275 | 7/1973 |
| WO | WO 2001004389 | 10/2001 |

OTHER PUBLICATIONS

Karpov et al, Analysis of Sublimation Growth of Bulk SiC Crystals in Tantalum Container, Journal of Crystal Growth, 2000, pp. 347-351, vol. 211.
Karpov et al, Excess Phase Formation During Sublimation Growth of Silicon Carbide, International Conference on Silicon Carbide and Related Materials, 1995, pp. 1-4, vol. ICSCRM-95.

(Continued)

Primary Examiner—Felisa Hiteshew
(74) Attorney, Agent, or Firm—Patent Law Office of David G. Beck

(57) ABSTRACT

A crucible is provided that is thermally stable at high temperatures and is suitable for use in the growth of large, bulk AlN, $Al_xGa_{1-x}N$ or other nitride single crystals. The crucible is comprised of specially treated tantalum. During the initial treatment, the walls of the crucible are carburized, thus achieving a crucible that can be subjected to high temperatures without deformation. Once the carburization of the tantalum is complete, the crucible undergoes further treatment to protect the surfaces that are expected to come into contact with nitride vapors during crystal growth with a layer of TaN. If the crucible is to be used with a graphite furnace, only the inner surfaces of the crucible are converted to TaN, thus keeping TaC surfaces adjacent to the graphite furnace elements. If the crucible is to be used with a non-graphite furnace, both the inner and outer surfaces of the crucible are converted to TaN.

44 Claims, 6 Drawing Sheets

OTHER PUBLICATIONS

Mokhov et al, Growing of Epitaxial Layers of Silicon Carbide, Vysokochistie Veshchestva, 1992, pp. 98-105, No. 3.

Mokhov et al, Growth of Silicon Carbide Bulk Crystals by the Sublimation Sandwich Method, Materials Science and Engineering, 1997, pp. 317-323, vol. B47.

Mokhov et al, SiC Growth in Tantalum Containers by Sublimation Sandwich Method, Journal of Crystal Growth, Apr. 3, 1997, pp. 254-258, vol. 181.

D. Hoffman et al, Use of Ta Container Material for Quality Improvement of SiC Crystals Grown by the Sublimation Technique, Int'l Conference on Silicon Carbide & Related Materials, 1995, pp. 1-4, vol. ICSCRM-95.

TANTALUM BASED CRUCIBLE

FIELD OF THE INVENTION

The present invention relates generally to the generation of monocrystalline nitrides and, more particularly, to the design and fabrication of a crucible suitable for growing monocrystalline nitrides.

BACKGROUND OF THE INVENTION

Aluminum nitride (AlN) is material that has a number of characteristics (i.e., structural, chemical, thermal and electrical) that make it an ideal candidate for a variety of applications including, but not limited to, sensors, light emitting diodes (LEDs), laser diodes (LDs) and insulating substrates for high frequency, high power electronics. AlN shares the same wurtzite crystal structure as GaN, thus epitaxial growth on AlN is not limited to the c-plane, but can also utilize the a- and m-planes. As such the polarization effects that are always present in films grown on c-plane substrates can be avoided by depositing the epitaxial layers on either the a- or m-plane. Additionally, the thermal conductivity of AlN is much higher than sapphire and comparable to that of 6H—SiC. Furthermore, AlN is chemically stable under $Al_xGa_{1-x}N$ epitaxial growth conditions, thus allowing uncontaminated layers to be grown. One of this material's most interesting characteristics is its surface acoustic wave (SAW) velocity which is the highest ever reported. As such, it is an excellent candidate for both piezoelectric and SAW devices.

The inability to realize all of the benefits offered by AlN is largely due to the unavailability of bulk single crystals with a diameter of at least 2 inches. The most commonly used method to produce AlN single crystals is the sublimation method which utilizes vapor-phase crystallization of an evaporated solid source. The primary difficulty encountered during the growth of AlN results from the strong reaction between the crucible material and the AlN vapors at high temperatures. This problem is exacerbated due to long growth cycles such as those required to grow large crystals, and due to the desired high growth temperatures.

High growth temperatures, for example temperatures in excess of 2200° C., provide the higher growth rates that are desirable for the growth of large, bulk AlN crystals. Additionally, the use of high growth temperatures helps reduce the thermal stress in the AlN crystals since such temperatures permit the use of smaller temperature gradients. By reducing thermal stress in the growing crystal, crystalline defects can be minimized. High growth temperatures also allow the aluminum and nitrogen atoms to locate in the best equilibrium lattice positions since surface adatom mobilities increase with temperature.

The most common refractory material used to grow AlN is graphite. It is relatively inexpensive and easy to mechanically process. Due to the electrical properties of graphite, it can be used in growth systems utilizing either resistance or RF heating. Unfortunately graphite does not have sufficient thermal stability to be used at temperatures greater than 1000° C. Furthermore, as a result of graphite's thermal instability, graphite crucibles degrade rapidly, often resulting in changes in the heat field distribution within the growth cell and unstable growth parameters. To counter this effect, growth cycles may be conducted in an inert atmosphere (e.g., argon, helium). However even under these growth conditions there are sufficient aluminum and nitrogen vapors to react with the graphite, leading to the graphite crucible's deterioration and ultimately its failure. Another disadvantage of graphite is that even the purest grades of graphite exhibit high impurity concentrations (e.g., boron, aluminum, nickel, chromium, copper, etc.) that affect the electrical properties and overall quality of the grown crystal.

Tantalum carbide (TaC) is another material that researchers have tried to use to grow AlN crystals. TaC crucibles have been used quite favorably to grow silicon carbide (SiC) crystals, in part because carbon is a constituent of both SiC and the crucible. If a TaC crucible is used to grow AlN crystals, however, the nitrogen vapors formed by the evaporating AlN source interact with the TaC crucible, resulting in nitrogen substituting for the carbon in the crucible and the vapor phase becoming doped with carbon. As the substitution process is most intense during the initial stages of growth, and as the initial stages of growth define the quality of the growing crystal, it is virtually impossible to grow a high quality AlN crystal with a TaC crucible.

Accordingly, what is needed in the art is a method that allows high quality, large diameter AlN single crystals to be grown. The present invention provides a crucible suitable for growing such crystals as well a method of manufacturing the same.

SUMMARY OF THE INVENTION

The present invention provides a method and apparatus for growing large, bulk AlN, $Al_xGa_{1-x}N$ or other nitride single crystals at high temperatures. In particular, a crucible is provided that is thermally stable at high temperatures and does not react strongly with AlN vapors. As a result of the allowable high growth temperatures, crystalline defects in the as-grown material are minimized.

In accordance with the invention, the desired source (e.g., AlN) and a seed crystal of the desired polytype are co-located within the crucible. The separation distance depends on the material to be grown; for an AlN source the distance separating the evaporating surface of the source and the growing surface is comparable to the track length of an AlN molecule. The growth zone is defined by the substantially parallel surfaces of the source and the seed in combination with the sidewalls of the crucible.

In further accordance with the invention, the crucible is comprised of tantalum that has been specially treated. During the initial treatment, the walls of the crucible are carburized, thus achieving a crucible that can be subjected to high temperatures without deformation. Once the carburization of the tantalum is complete, the crucible undergoes further treatment to protect the surfaces that are expected to come into contact with the nitride vapors (e.g., AlN) during crystal growth with a layer of TaN. If the crucible is to be used with a graphite furnace, only the inner surfaces of the crucible are converted to TaN, thus keeping TaC surfaces adjacent to the graphite furnace elements. If the crucible is to be used with a non-graphite furnace, both the inner and outer surfaces of the crucible are converted to TaN.

The crucible is initially fabricated from tantalum that is preferably at least 99.9 percent pure. Once the crucible is shaped, it undergoes a series of processing steps to clean the surfaces and remove surface contaminants. A thin, near-surface layer of Ta—C is then formed and annealed, resulting in a surface that will not interact with carbon particles. Lastly the crucible is annealed in a nitrogen environment to convert the desired surfaces (i.e., inner or inner/outer crucible surfaces) to TaN.

A further understanding of the nature and advantages of the present invention may be realized by reference to the remaining portions of the specification and the drawings.

DESCRIPTION OF THE SPECIFIC EMBODIMENTS

Figure 1:
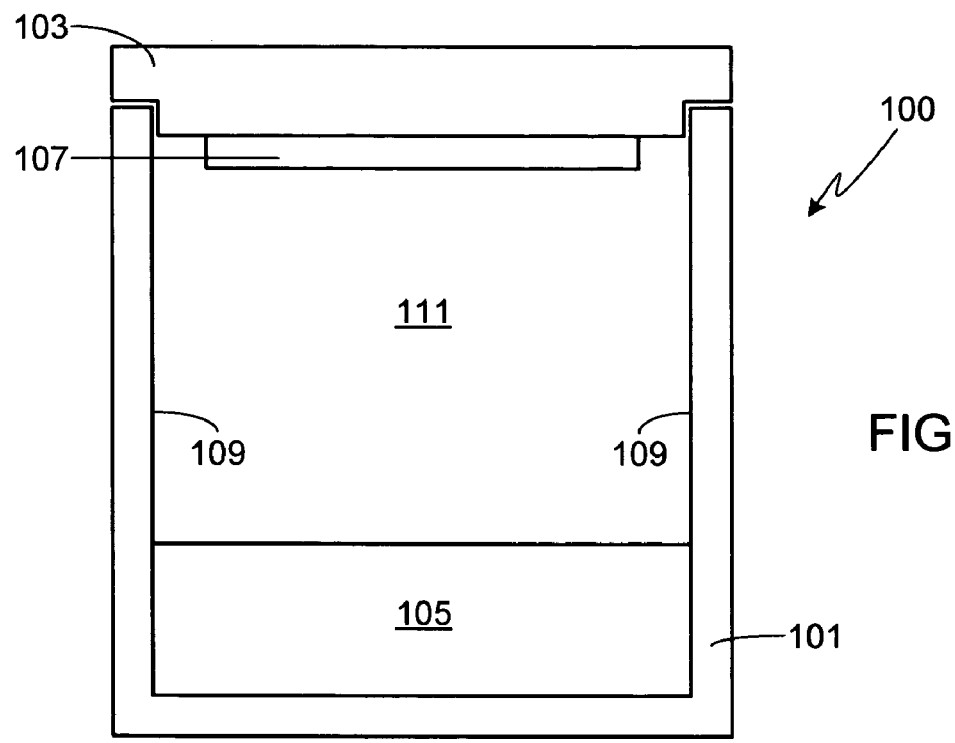
FIG. 1 is a cross-sectional view of a crucible according to the invention.

FIG. 1 is a cross-sectional view of a crucible 100 in accordance with the invention for use in growing AlN, $Al_xGa_{1-x}N$ or other nitride crystals using the sublimation technique. The crucible includes a main portion 101 and a lid portion 103. In the preferred embodiment and assuming that the crystal to be grown is to be comprised of AlN, an AlN source 105 is located on the bottom of crucible portion 101 and a seed crystal 107 is mounted to the inner surface of crucible lid 103, the growth surface of seed crystal 107 and the surface of source 105 being substantially parallel to one another. Alternately, source 105 can be mounted to the inner surface of crucible lid 103 and the seed crystal 107 located on the bottom of crucible portion 101. In order to prevent the loss of the source material due to precipitation of source vapors outside of the growth surface, preferably the inner dimensions of crucible 100 in general, and crucible sidewalls 109 in particular, do not exceed the dimensions of axial growth zone 11 1. If the inner dimensions of sidewalls 109 do exceed the dimensions of axial growth zone 111, preferably it is by a minor amount. Preferably the distance between the evaporating surface of source 105 and the growing surface of seed crystal 107 is not much in excess of the track length of an AlN molecule, assuming that the material to be grown is AlN. This configuration enhances the crystal growth rate as the precipitation of source vapors outside of the seed crystal growth surface is minimized.

If the crystal to be grown in crucible 100 is to be comprised only of AlN and brought about only by the mass transport of AlN vapors from the source to the seed, preferably crucible portion 101 and lid portion 103 are vacuum sealed, thus allowing the vapor phase composition within the growth zone to remain close to stoichiometric. Alternately, the crucible may remain unsealed but maintained within a nitrogen environment sufficient to keep the vapor composition within the crucible close to stoichiometric. Alternately, the crucible may be sealed and maintained within a nitrogen environment, thus insuring that if the crucible has a leak due to a failed seal, a close to stoichiometric composition can be maintained.

FIG. 1 shows a single seed 107. It will be appreciated that the invention is not limited to the use of a single seed and in fact multiple seeds can be used. If multiple seed crystals are used, preferably their growth surfaces are located within the same plane and are parallel to the evaporating surface of source 105.

Figure 2:
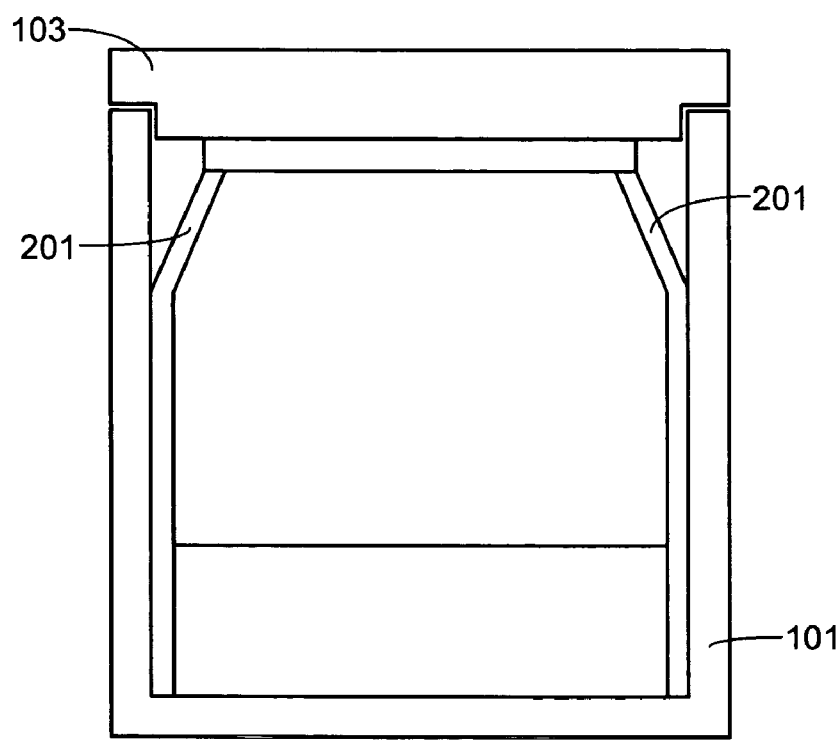
FIG. 2 illustrates one seed mounting method for use with the crucible shown in FIG. 1.

It will be appreciated that there are many methods known by those of skill in the art for mounting seed crystal 107 within crucible 100. FIG. 2 illustrates one mounting method in which a seed holder 201 is located within the crucible. Preferably seed holder 201 is comprised of tantalum that has been treated to form TaN surfaces as described in detail below relative to crucible 100.

Crucible 100 is comprised of tantalum (Ta) that has been treated to alter the crucible's surface characteristics. The exact treatment used to alter the crucible's surface characteristics and the final structure depends on the type of furnace that is to be used with the crucible. Preferably if a graphite heating system will be used with the crucible, the crucible is sealed during use and treated so that the inner crucible walls 301 that will be exposed to components of AlN vapor during the growth process are comprised of TaN (see FIG. 3). Exterior crucible walls 303 which will be adjacent to elements of the graphite heating system are comprised of TaC Preferably if a non-graphite heating system will be used, an alternate crucible design is used in which both the inner and exterior crucible walls 401 are comprised of TaN (see FIG. 4). In this configuration it is less important to seal the crucible during use.

As a result of converting the surfaces in contact with AlN vapor to TaN, the ability of the surface to absorb AlN vapors as the monocrystalline AlN is grown are significantly impacted. Consequently, during crystal growth the vapor-phase composition within the crucible is close to stoichiometric. Additionally, the portions of the crucible comprised of TaC are able to withstand the operating temperatures required to grow the AlN single crystal without deforming or otherwise failing.

Figure 3:
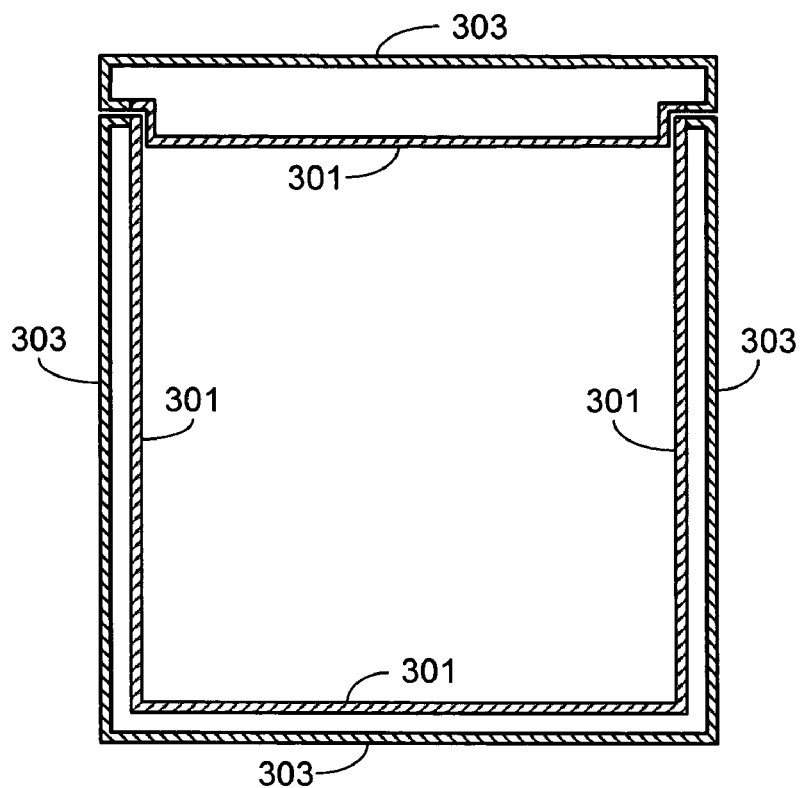
FIG. 3 is a cross-sectional view of a crucible for use with a graphite heating system.
Figure 4:
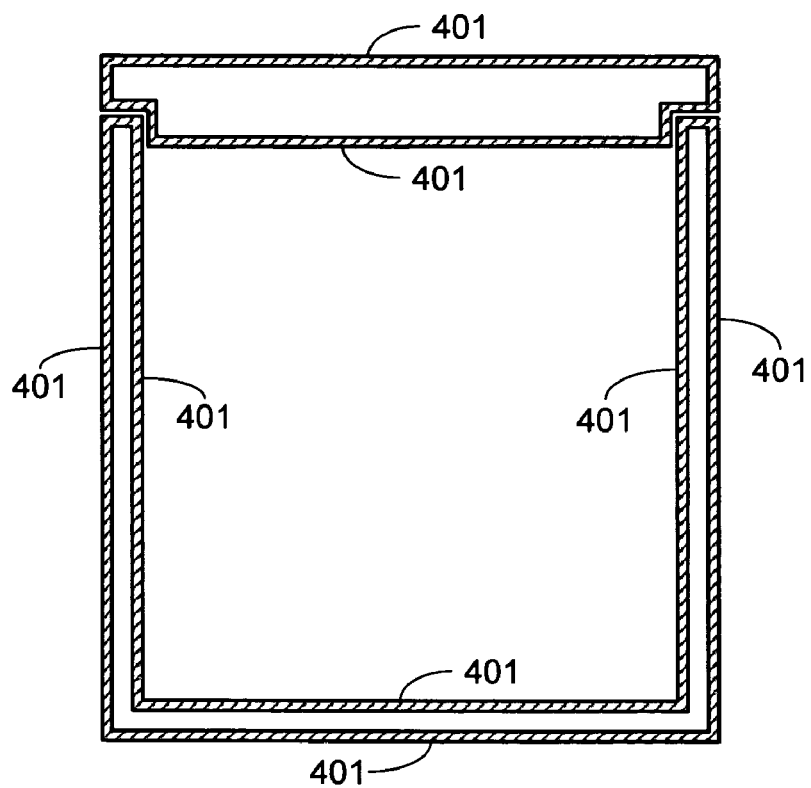
FIG. 4 is a cross-sectional view of a crucible for use with a non-graphite heating system.
Figure 5:
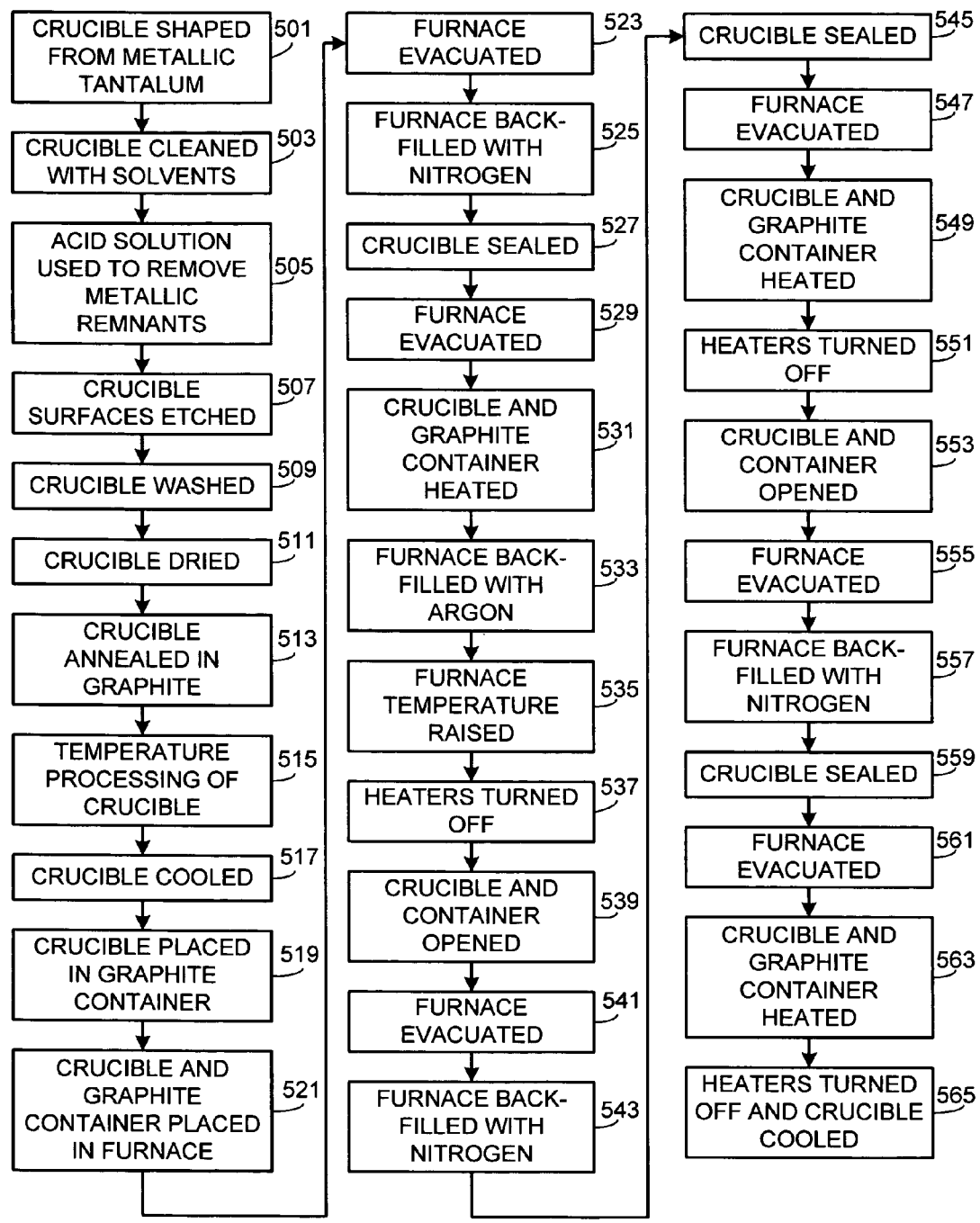
FIG. 5 illustrates the methodology of preparing a crucible suitable for use with a graphite heating system.

FIG. 5 illustrates the primary steps in preparing a crucible such as the one shown in FIG. 3. Initially crucible 100 is fabricated from metallic tantalum (step 501), the metal being at least 99.9 percent pure and of any suitable shape (e.g., rod, rolled, etc.). It is understood that the shape of crucible 100 is not limited to the shape shown in FIGS. 1–4. Once the crucible has been shaped, for example using standard machining processes, it is initially cleaned with standard organic solvents (step 503). An acid solution is then used to remove metallic remnants left on the surface after crucible shaping (step 505). Preferably in this step the crucible is boiled for 30 minutes in a pre-heated acid solution comprised of a 3:1 mixture of HCl and $HNO_3$. Preferably the crucible is then etched in a room temperature 1:1 mixture of $HNO_3$ and HF for approximately 20 to 30 seconds (step 507). This etching step must be short to insure that the etchant does not damage the surface finish quality of the crucible. After etching, the crucible is washed in distilled or deionized boiling water, preferably for at least 10 minutes with the water being changed at least three times during the process (step 509). Once the cleaning is complete, the crucible is dried (step 511).

After the crucible has been fabricated and the surfaces cleaned, preferably following the above-described process, the crucible is processed in carbon containing vapor in order to form a thin, near-surface layer of Ta—C. Preferably the carbon processing follows the following steps. Although the crucible can be annealed at a pressure of $10^{-1}$ Torr or less in carbon containing vapor, preferably the crucible is annealed at a pressure of $10^{-3}$ Torr or less in graphite that is at least 99.99 percent pure (step 513). In the latter process, the crucible is placed entirely within a graphite container filled with graphite powder. Preferably a step-wise annealing process is used to avoid crucible deformation or cracking. Assuming that the crucible is annealed in graphite, the annealing furnace is first evacuated to the best possible vacuum, typically on the order of $10^{-3}$–$10^{-4}$ Torr, and the crucible is annealed at a temperature of between about 800° and 1000° C. for at least one hour and more preferably two hours. The annealing temperature is then raised to a temperature of between about 1500° and 1600° C. and the crucible is annealed for at least one hour and more preferably three hours. The annealing temperature is then raised again to a temperature of approximately 2000° in argon at about $10^{-1}$ Torr for two hours and more preferably three hours.

As a result of this annealing process, a thin near-surface layer comprised of Ta-C carbides is formed on the entire surface of the crucible. The depth of the carbon saturated layer is approximately 500–700 microns assuming the crucible is formed of materials prepared by powder metallurgy. Note that if the crucible is formed of material prepared by vacuum melting or metal rolling, the carbon penetration level is considerably less (i.e., approximately 5 to 30 microns with the above process). The greater penetration depth for materials prepared by powder metallurgy is due to accelerated diffusion along grain boundaries. Accordingly, the inventors have found that the quality of the carbide layer as well as the boundary between the metal and the carbide is governed by the technique used to fabricate the tantalum used in the crucible (e.g., powder metallurgy, rolled metal, vacuum melting, etc.).

After formation of the carbide layer, the crucible is subjected to further temperature processing (step 515), thus assuring that the layer protects the surface of the crucible from interaction with carbon particles. During this processing step the crucible is placed in graphite powder in an argon atmosphere, the graphite powder being at least 99.99 percent pure with a grain size of less than 100 microns and the argon being at least 99.999 percent pure. An annealing temperature of between 2500° and 2600° C. is used with an annealing time of at least 2 hours. The annealing time is governed by the thickness of the crucible. After completion of the annealing process the crucible is cooled to room temperature at a cooling rate of less than 20° C. per minute (step 517). Additionally, during each annealing step the temperature variation across the surface of the crucible should be less than 20° C. After all stages of annealing are complete, the amount of carbon that has penetrated into the tantalum crucible surfaces should be more than 0.02 grams per square centimeter.

Figure 6:
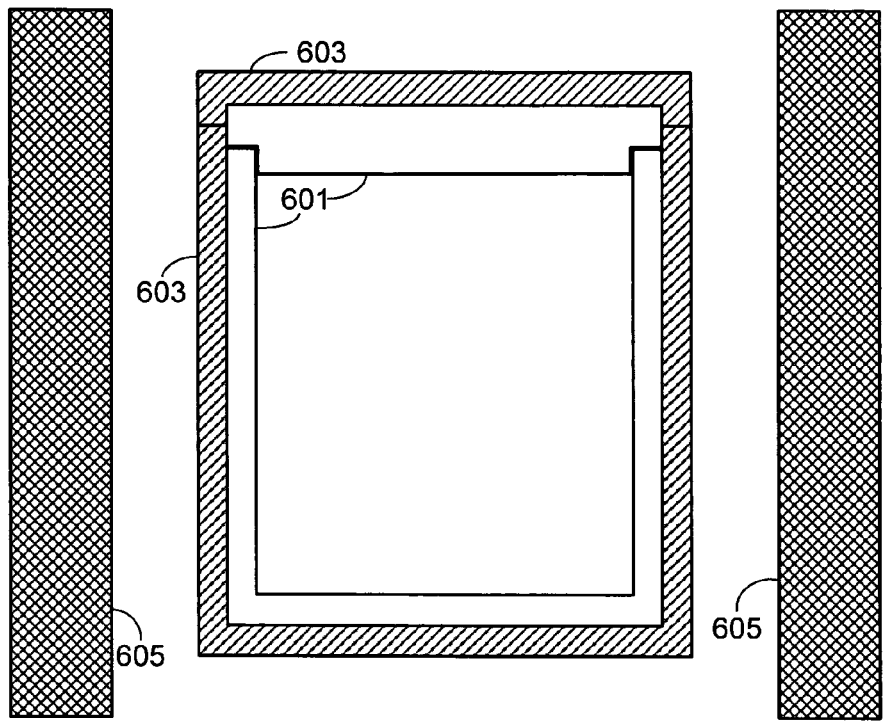
FIG. 6 illustrates the crucible set-up during TaN conversion of inner crucible surfaces.

Assuming that the crucible is to be used in a graphite heating system, as previously noted the inner surfaces of the crucible must be converted to TaN (e.g., FIG. 3). The first step in converting the inner surfaces to TaN is to place the crucible 601 in a graphite container 603 as illustrated in FIG. 6 (step 519). The crucible and graphite container are then placed in a furnace 605 (step 521) and the furnace is evacuated down to a pressure of at least $10^{-5}$ Torr (step 523). After back-filling the furnace with nitrogen to a pressure of 500–600 Torr (step 525), the TaC crucible is then sealed (step 527) resulting in nitrogen being sealed within the crucible. The furnace is once again evacuated to a pressure of at least $10^{-5}$ Torr (step 529) and then heated to a temperature of approximately 1500° C. (step 531). During the heating step, the furnace is continually pumped, preferably to a pressure of at least $10^{-4}$ Torr, thereby removing any nitrogen from the volume surrounding the crucible/container. This step is preferably performed for an hour.

The next step is to back-fill the furnace with an inert gas, preferably argon, to a pressure of approximately 650 Torr (step 533). The furnace temperature is then raised to approximately 1800° C. (step 535), this step performed for approximately two hours. After completion of this stage of the processing, the inner surface of crucible is converted to TaN, typically to a depth of approximately 30–40 microns.

During the above process, typically a portion of the nitrogen sealed within the crucible escapes due to an imperfect seal. Even if nitrogen does not escape from the crucible, it becomes contaminated due to desorption of carbon and other impurities off the inner walls of the container. Accordingly, the nitrogen charge within the crucible is preferably replenished. To do so, the furnace heaters are first turned off (step 537). Then after the crucible and graphite container have cooled, the graphite container and the crucible lid are opened (step 539) and the system evacuated to as low a pressure as possible, preferably to at least $10^{-4}$ Torr and more preferably to at least $10^{-5}$ Torr (step 541). The system is then back-filled with nitrogen, preferably to a pressure of 500–600 Torr (step 543), and the TaC crucible is resealed (step 545). The furnace is then evacuated to a pressure of at least $10^{-5}$ Torr (step 547) and then heated for approximately 4 hours at a temperature of approximately 2200° C. (step 549). As before, during the heating step the furnace is continually pumped. After this stage of processing the converted TaN has a depth of approximately 500–700 microns.

In preparation for a last conversion step, the furnace heaters are again turned off (step 551), the graphite container and the crucible are opened after cool down (step 553) and the system is evacuated to as low a pressure as possible, preferably to at least $10^{-4}$ Torr and more preferably to at least $10^{-5}$ Torr (step 555). The system is then back-filled with nitrogen, preferably to a pressure of 500–600 Torr (step 557), and the TaC crucible is once again resealed (step 559). The furnace is then evacuated to a pressure of at least $10^{-5}$ Torr (step 561) and then heated for approximately 6 hours at a temperature of approximately 2400° C. (step 563). As before, during the heating step the furnace continues to be pumped. After this stage of processing, the converted TaN has a depth of approximately 1.5 millimeters. The heaters are then turned off and the crucible allowed to cool (step 565). The crucible, now of the structure shown in FIG. 3, is ready to be used to grow AlN, $Al_xGa_{1-x}N$ or other nitride crystals.

Figure 7:
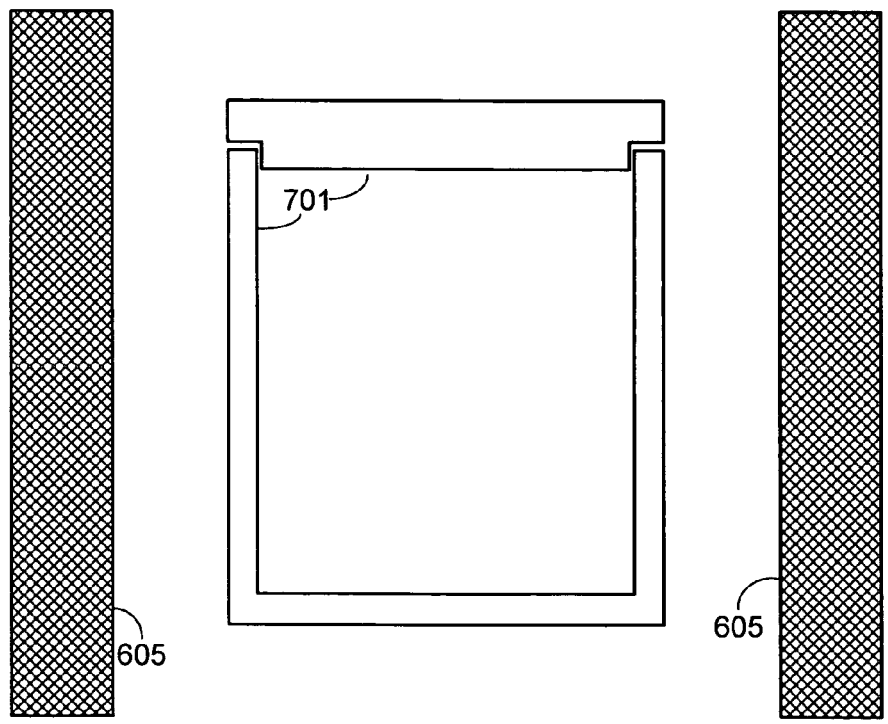
FIG. 7 illustrates the crucible set-up during TaN conversion of inner and outer crucible surfaces.
Figure 8:
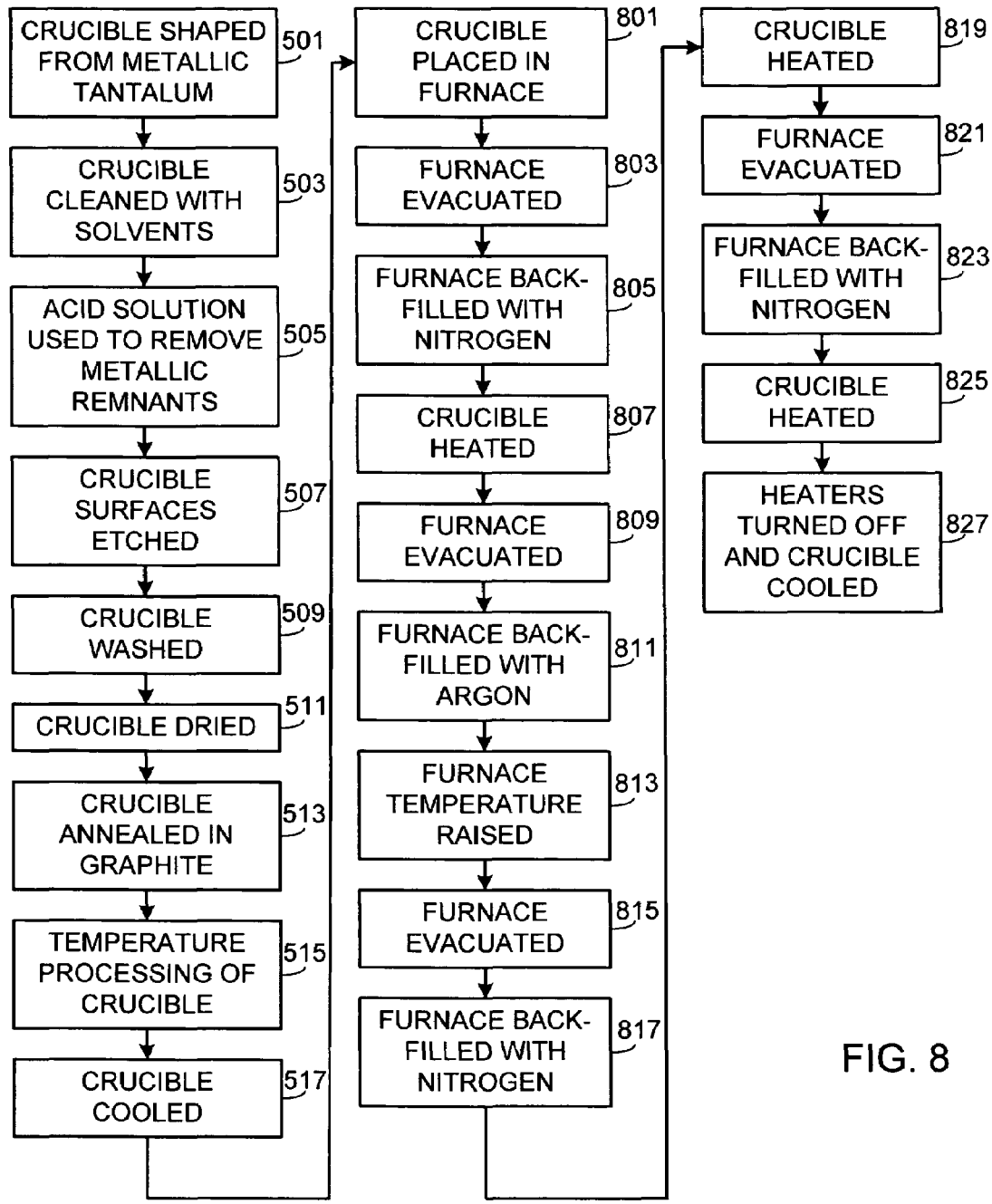
FIG. 8 illustrates the methodology of preparing a crucible suitable for use with a non-graphite heating system.

If the crucible is to be used in a non-graphite furnace, the crucible is prepared as described below and illustrated in FIGS. 7 and 8. Initially, the steps to prepare this crucible are the same as those used to prepare a crucible for use in a graphite furnace. However, after the surfaces of the crucible have converted to Ta-C, the processing steps are different. This difference is because the goal of this process is to convert both the inner and outer surfaces of the crucible to TaN. Accordingly, the TaC crucible 701 and crucible lid 701 are not placed within a graphite container. Rather, the TaC crucible and lid are placed directly into furnace 605 (step 801) and the furnace is evacuated down to a pressure of at least $10^{-5}$ Torr (step 803). Note that although the crucible lid may be placed on the crucible, it is not hermetically sealed to the crucible, thus allowing the pressure within the container to be the same as that in the surrounding volume (within the furnace).

The furnace is then back-filled with nitrogen to a pressure of 500–600 Torr (step 805) and heated to a temperature of approximately 1500° C. (step 807) for approximately one hour. Next, the furnace is evacuated (step 809) and then back-filled with an inert gas, preferably argon, to a pressure of approximately 650 Torr (step 811). The furnace temperature is then raised to approximately 1800° C. (step 813) and held at that temperature for approximately two hours. After completion of this stage of the processing, the inner and outer surfaces of the crucible are converted to TaN, typically to a depth of approximately 30–40 microns.

The first step of the next stage of processing is to evacuate the furnace to as low a pressure as possible, preferably to at least $10^{-4}$ Torr and more preferably to at least $10^{-5}$ Torr (step 815). The system is then back-filled with nitrogen, preferably to a pressure of 500–600 Torr (step 817), and then heated for approximately 4 hours at a temperature of approximately 2200° C. (step 819). After this stage of processing, the converted TaN has a depth of approximately 500–700 microns. Preferably prior to the last stage of treatment, the system is evacuated (step 821), thus eliminating possible sources of contamination. Then the system is back-filled with nitrogen, preferably to a pressure of 500–600 Torr (step 823), and then heated for approximately 6 hours at a temperature of approximately 2400° C. (step 825). After this stage of processing, the converted TaN has a depth of approximately 1.5 millimeters. The heaters are then turned off and the crucible allowed to cool (step 827). The crucible, now of the structure shown in FIG. 4, is ready to be used to grow AlN, $Al_xGa_{1-x}N$ or other nitride crystals.

Figure 9:
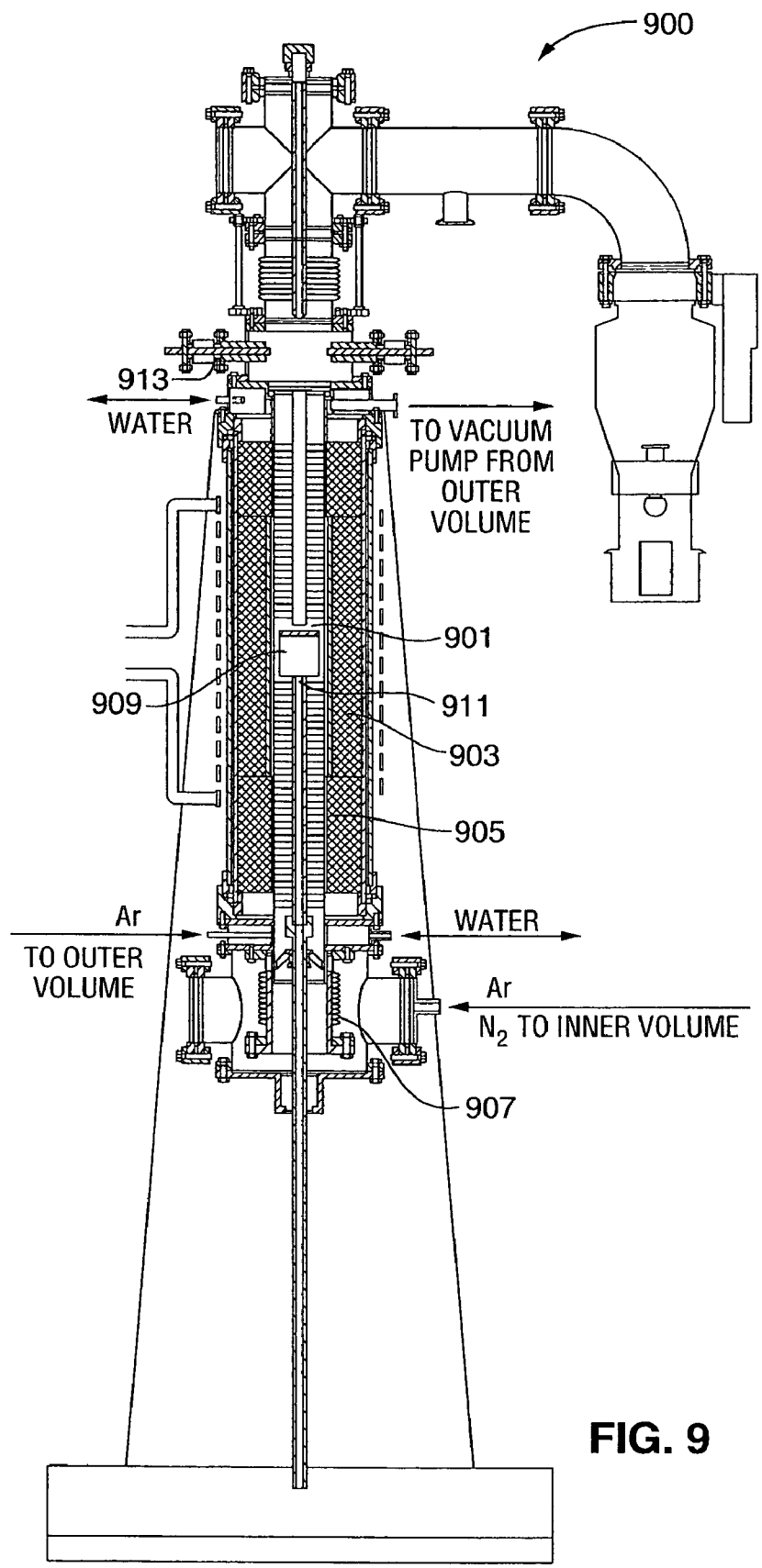
FIG. 9 is an illustration of a growth furnace that can be used with either embodiment of the crucible of the present invention.

FIG. 9 is an illustration of a growth furnace that can be used with either embodiment of the crucible of the present invention. It will be appreciated that the current invention is not limited to use with this particular furnace. Furnace 900 is a double-walled, quartz, water-cooled induction heated reactor with an operational temperature of up to 2500° C. with a graphite heater, and up to 2700° C. with a tantalum or tungsten heater. Furnace 900 is designed for operation at up to $10^{-5}$ Torr, preferably with either an inert or nitrogen atmosphere. This furnace includes two separate and independent vacuum volumes, 901 and 903, separated by tube 905. Volume 901 includes the growth zone while volume 903 accommodates the heating and thermoinsulation components. Tube 905 is preferably comprised of either tantalum or tungsten. Bellows 907 compensates for thermal expansion of tube 905. Crucible 909 is held in place within volume 901 using crucible holder 911. This design also includes a manipulator 913 for use in sealing and opening crucible 909.

As will be understood by those familiar with the art, the present invention may be embodied in other specific forms without departing from the spirit or essential characteristics thereof. Accordingly, the disclosures and descriptions herein are intended to be illustrative, but not limiting, of the scope of the invention which is set forth in the following claims.

What is claimed is:

1. A method of fabricating a crucible, the method comprising the steps of:
    forming the crucible from a tantalum material, the crucible including an inner surface and an outer surface;
    carburizing said inner and outer surfaces; and
    forming an interior tantalum nitride layer on said inner surface.

2. A method of fabricating a crucible, the method comprising the steps of:
    forming the crucible from a tantalum material, the crucible including an inner surface and an outer surface;
    carburizing said inner and outer surfaces;
    forming an interior tantalum nitride layer on said inner surface; and
    forming an exterior tantalum nitride layer on said outer surface.

3. A method of fabricating a crucible, the method comprising the steps of:
    shaping the crucible from a tantalum material, the crucible including a plurality of inner surfaces and a plurality of outer surfaces;
    cleaning said plurality of inner and outer surfaces;
    forming a TaC layer on said plurality of inner and outer surfaces; and
    forming a TaN layer on said plurality of inner surfaces.

4. The method of claim 3, further comprising the step of selecting a purity level of said tantalum material to be at least 99.9 percent.

5. The method of claim 3, wherein said cleaning step further comprises the step of cleaning the crucible with at least one organic solvent.

6. The method of claim 3, wherein said cleaning step further comprises the step of boiling said crucible in an acid solution.

7. The method of claim 6, wherein said acid solution is comprised of a mixture of HCl and $HNO_3$ acids.

8. The method of claim 3, further comprising the step of etching said crucible after completion of said cleaning step.

9. The method of claim 8, wherein said etching step is performed using a mixture of $HNO_3$ and HF acids.

10. The method of claim 3, wherein said TaC layer forming step further comprises the step of annealing said crucible in at least 99.99 percent pure graphite.

11. The method of claim 10, wherein said annealing step further comprises the step of maintaining an annealing pressure of $10^{-3}$ Torr or less.

12. The method of claim 10, wherein said annealing step is comprised of a first annealing step at a first temperature of between 800° C. and 1000° C., a second annealing step at a second temperature of between 1500° C. and 1600° C., and a third annealing step at a third temperature of approximately 2000° C.

13. The method of claim 12, wherein said first annealing step is performed for at least one hour, said second annealing step is performed for at least one hour, and said third annealing step is performed for approximately two hours.

14. The method of claim 12, wherein said first annealing step is performed for at least two hours, said second annealing step is performed for at least three hour, and said third annealing step is performed for at least three hours.

15. The method of claim 10, further comprising the step of temperature processing, wherein said temperature processing step is performed after said annealing step.

16. The method of claim 15, wherein said temperature processing step further comprises the steps of:
    placing said crucible in graphite powder; and
    annealing said crucible at a temperature between 2500° C. and 2600° C. for at least two hours in an argon atmosphere.

17. The method of claim 3, wherein said TaN layer forming step further comprises the steps of:
    sealing a nitrogen atmosphere into said crucible;
    placing said crucible within a graphite container; and heating said crucible and said graphite container while maintaining a furnace pressure of $10^{-4}$ Torr or less.

18. The method of claim 17, wherein said step of placing said crucible within said graphite container is performed prior to said sealing step.

19. The method of claim 17, wherein said heating step is performed in a nitrogen atmosphere at a temperature of approximately 1500° C. for at least one hour.

20. The method of claim 19, further comprising the step of heating said crucible and said graphite container to a temperature of approximately 1800° C. for at least two hours in an inert atmosphere, wherein this step is performed after said heating step.

21. The method of claim 3, wherein said TaN layer forming step further comprises the steps of:
placing said crucible within a graphite container;
sealing a first nitrogen atmosphere into said crucible;
heating said crucible and said graphite container to a first temperature for a first amount of time within a furnace while maintaining a furnace pressure of $10^{-4}$ Torr or less;
back-filling said furnace with an inert gas;
heating said crucible and said graphite container to a second temperature for a second amount of time;
sealing a second nitrogen atmosphere into said crucible;
heating said crucible and said graphite container to a third temperature for a third amount of time while maintaining said furnace pressure of $10^{-4}$ Torr or less;
sealing a third nitrogen atmosphere into said crucible; and
heating said crucible and said graphite container to a fourth temperature for a fourth amount of time while maintaining said furnace pressure of $10^{-4}$ Torr or less.

22. The method of claim 21, wherein said first temperature is approximately 1500° C., said second temperature is approximately 1800° C., said third temperature is approximately 2200° C., and said fourth temperature is approximately 2400° C.

23. The method of claim 22, wherein said first amount of time is approximately one hour, said second amount of time is approximately two hours, said third amount of time is approximately four hours, and said fourth amount of time is approximately six hours.

24. The method of claim 21, said step of sealing said second nitrogen atmosphere into said crucible further comprising the steps of cooling said crucible, unsealing said crucible, evacuating said crucible, and back-filling said crucible with nitrogen.

25. The method of claim 21, said step of sealing said third nitrogen atmosphere into said crucible further comprising the steps of cooling said crucible, unsealing said crucible, evacuating said crucible, and back-filling said crucible with nitrogen.

26. A method of fabricating a crucible, the method comprising the steps of:
shaping the crucible from a tantalum material, the crucible including a plurality of inner surfaces and a plurality of outer surfaces;
cleaning said plurality of inner and outer surfaces;
forming a TaC layer on said plurality of inner and outer surfaces; and
forming a TaN layer on said plurality of inner surfaces and said plurality of outer surfaces.

27. The method of claim 26, further comprising the step of selecting a purity level of said tantalum material to be at least 99.9 percent.

28. The method of claim 26, wherein said cleaning step further comprises the step of cleaning the crucible with at least one organic solvent.

29. The method of claim 26, wherein said cleaning step further comprises the step of boiling said crucible in an acid solution.

30. The method of claim 29, wherein said acid solution is comprised of a mixture of HCl and $HNO_3$ acids.

31. The method of claim 26, further comprising the step of etching said crucible after completion of said cleaning step.

32. The method of claim 31, wherein said etching step is performed using a mixture of $HNO_3$ and HF acids.

33. The method of claim 26, wherein said TaC layer forming step further comprises the step of annealing said crucible in at least 99.99 percent pure graphite.

34. The method of claim 33, wherein said annealing step further comprises the step of maintaining an annealing pressure of $10^{-3}$ Torr or less.

35. The method of claim 33, wherein said annealing step is comprised of a first annealing step at a first temperature of between 800° C. and 1000° C., a second annealing step at a second temperature of between 1500° C. and 1600° C., and a third annealing step at a third temperature of approximately 2000° C.

36. The method of claim 35, wherein said first annealing step is performed for at least one hour, said second annealing step is performed for at least one hour, and said third annealing step is performed for approximately two hours.

37. The method of claim 35, wherein said first annealing step is performed for at least two hours, said second annealing step is performed for at least three hour, and said third annealing step is performed for at least three hours.

38. The method of claim 33, further comprising the step of temperature processing, wherein said temperature processing step is performed after said annealing step.

39. The method of claim 38, wherein said temperature processing step further comprises the steps of:
placing said crucible in graphite powder; and
annealing said crucible at a temperature between 2500° C. and 2600° C. for at least two hours in an argon atmosphere.

40. The method of claim 26, wherein said TaN layer forming step further comprises the steps of:
placing said crucible within a furnace;
evacuating said furnace;
back-filling said furnace with nitrogen; and
heating said crucible.

41. The method of claim 26, wherein said TaN layer forming step further comprises the steps of:
placing said crucible within a furnace;
evacuating said furnace;
back-filling said furnace with nitrogen;
heating said crucible to a first temperature for a first amount of time;
heating said crucible to a second temperature for a second amount of time, wherein said second temperature is higher than said first temperature; and
heating said crucible to a third temperature for a third amount of time, wherein said third temperature is higher than said second temperature.

42. The method of claim 41, wherein said first temperature is at least 1500° C., said second temperature is approximately 2200° C., and said third temperature is approximately 2400° C.

43. The method of claim 42, wherein said first amount of time is approximately one hour, said second amount of time is approximately four hours, and said third amount of time is approximately six hours.

44. The method of claim 41, further comprising the steps of:

evacuating said furnace;

back-filling said furnace with argon; and heating said crucible to a temperature of approximately 1800° C. for at least two hours, wherein the steps of evacuating, back-filling with argon and heating to approximately 1800° C. are performed after said step of heating said crucible to said first temperature and before said step of heating said crucible to said second temperature.

* * * * *